United States Patent
Lee (10) Patent No.: US 10,346,735 B1
(45) Date of Patent: Jul. 9, 2019

(54) ASSEMBLING BUCKLE STRUCTURE FOR MEMORY CIRCUIT BOARD

(71) Applicant: Wen-Yi Lee, New Taipei (TW)

(72) Inventor: Wen-Yi Lee, New Taipei (TW)

(73) Assignee: Wen-Yi Lee, New Taipei (TW)

( * ) Notice: Subject to any disclaimer, the term of this patent is extended or adjusted under 35 U.S.C. 154(b) by 0 days.

(21) Appl. No.: 16/147,589

(22) Filed: Sep. 29, 2018

(51) Int. Cl.
*H05K 5/02* (2006.01)
*H05K 5/03* (2006.01)
*G06K 19/077* (2006.01)

(52) U.S. Cl.
CPC ..... *G06K 19/07732* (2013.01); *H05K 5/0221* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 4,346,952 A * | 8/1982 | Bright | ................... | H05K 7/1069 439/70 |
| 5,001,603 A * | 3/1991 | Villaneuva, III | .... | H05K 5/0234 248/615 |
| 5,373,104 A * | 12/1994 | Brauer | ................. | H05K 5/0013 174/562 |
| 5,613,237 A * | 3/1997 | Bent | ...................... | H04B 1/086 220/4.02 |
| 5,886,402 A * | 3/1999 | Onoda | ................. | H05K 5/0269 257/678 |
| 5,923,026 A * | 7/1999 | Onoda | ................. | G06K 19/077 235/486 |
| 5,931,514 A * | 8/1999 | Chung | .................... | F16B 12/26 220/326 |
| 6,075,709 A * | 6/2000 | Yang | .................... | H05K 5/0282 361/736 |
| 6,111,760 A * | 8/2000 | Nixon | .................. | H05K 5/0013 220/4.02 |
| 6,166,913 A * | 12/2000 | Fun | ...................... | H05K 5/0269 361/736 |
| 6,552,911 B1 * | 4/2003 | Haupt | .................... | B23K 26/28 174/50 |
| 6,894,891 B2 * | 5/2005 | Darr | ....................... | H05K 7/142 361/601 |
| 6,992,901 B1 * | 1/2006 | Hung | ................... | H05K 9/0009 174/385 |
| 7,242,552 B2 * | 7/2007 | Kudo | ................... | G11B 25/043 360/97.12 |
| 8,059,418 B2 * | 11/2011 | Blake, III | ............. | H05K 5/066 361/752 |

(Continued)

*Primary Examiner* — Xanthia C Cunningham (57) ABSTRACT

An assembling buckle structure for memory circuit board includes: a base, two sides thereof are respectively formed with an elastic lateral plate having at least a buckle part, two ends of the lateral plate is formed with at least an outer mounting convex and a fasten post, the rear end of the base is formed with a tail plate having at least a buckle part; a memory circuit board disposed in the base, the front end thereof is formed with a connection seat; and a cover, covered and engaged with the base, the front end thereof is formed with a penetrated hole, two inner ends thereof are formed with at least an inner mounting concave; accordingly, the memory circuit board, the base and the cover are able to be stably buckled and combined in any direction without using any screw.

13 Claims, 6 Drawing Sheets

(56) References Cited

U.S. PATENT DOCUMENTS

| | | | | |
|---|---|---|---|---|
| 8,206,161 B1* | 6/2012 | Lan | ............... | H01R 13/6658 |
| | | | | 439/607.22 |
| 8,213,182 B2* | 7/2012 | Aoki | ............... | H05K 5/0269 |
| | | | | 361/737 |
| 8,243,456 B2* | 8/2012 | Tochi | ............... | G06K 7/0047 |
| | | | | 361/737 |
| 8,480,186 B2* | 7/2013 | Wang | ............... | H05K 5/0013 |
| | | | | 312/223.1 |
| 8,531,845 B2* | 9/2013 | Chen | ............... | H05K 5/0208 |
| | | | | 361/752 |
| 9,468,111 B2* | 10/2016 | Yin | ............... | H05K 5/006 |
| 9,510,474 B2* | 11/2016 | Chou | ............... | H05K 7/142 |
| 9,541,967 B1* | 1/2017 | Chen | ............... | G11B 33/025 |
| 9,545,019 B2* | 1/2017 | Ishikura | ............... | H05K 5/0004 |
| 9,585,262 B2* | 2/2017 | Nedved | ............... | H05K 5/0013 |
| 9,585,270 B2* | 2/2017 | Yang | ............... | H05K 5/0247 |
| 9,717,153 B2* | 7/2017 | Dernier | ............... | H05K 5/0013 |
| 9,750,146 B2* | 8/2017 | Kaihara | ............... | G07C 9/00944 |
| 9,814,147 B2* | 11/2017 | Igari | ............... | H05K 5/006 |
| 9,933,822 B2* | 4/2018 | Tan | ............... | H05K 5/0008 |
| 9,962,756 B2* | 5/2018 | Tang | ............... | B21D 51/52 |
| 2004/0264113 A1* | 12/2004 | Darr | ............... | H05K 7/142 |
| | | | | 361/601 |
| 2006/0232948 A1* | 10/2006 | Haager | ............... | H05K 7/1417 |
| | | | | 361/752 |
| 2010/0061044 A1* | 3/2010 | Zou | ............... | B32B 3/02 |
| | | | | 361/679.01 |
| 2011/0115349 A1* | 5/2011 | Dernier | ............... | H05K 5/0013 |
| | | | | 312/223.1 |

* cited by examiner

ASSEMBLING BUCKLE STRUCTURE FOR MEMORY CIRCUIT BOARD

BACKGROUND OF THE INVENTION

1. Field of the Invention

The present invention relates to an assembling buckle structure, especially to am assembling buckle structure for memory circuit board allowing a memory circuit board to be respectively mounted in buckle parts respectively formed on elastic lateral plates and a tail plate of a base, and a cover is provided which allows two edges of a penetrated hole thereof to be used for being covered, positioned and fastened with concave grooves formed at two sides of a connection seat of the memory circuit board, and inner mounting concaves formed at two sides of the cover are enabled to be mounted with outer mounting convexes formed on the lateral plates of the base so as to be mutually combined.

SUMMARY OF THE INVENTION

For improving the disadvantages existed in prior art, one primary objective of the present invention is to provide an assembling buckle structure for memory circuit board, in which two sides and the rear end of a memory circuit board are enabled to be respectively mounted in buckle parts respectively formed on elastic lateral plates of a base and a tail plate of the base thereby eliminating the gap formed between the memory circuit board and the base, and a cover is provided which allows two edges of a penetrated hole thereof to be used for being covered, positioned and fastened with concave grooves formed at two sides of a connection seat of the memory circuit board.

Another objective of the present invention is to provide an assembling buckle structure for memory circuit board, in which inner mounting concaves formed at two sides of a cover and outer mounting convexes formed on lateral plates of a base being mutually mounted so as to be combined.

One another objective of the present invention is to provide an assembling buckle structure for memory circuit board, in which a cover is formed with a detach hole adjacent to an inner mounting concave thereby enabling a base to be assembled or detached.

Still one another objective of the present invention is to provide an assembling buckle structure for memory circuit board, in which a memory circuit board, a base and a cover are able to be stably buckled and combined in any direction without using any screw, thereby increasing the convenience in assembly.

Disadvantages to be solved by the present invention are that: when a conventional memory circuit board is desired to be combined with a base and a cover which cover the outer periphery thereof, a plurality of screw holes and screw studs are required to be formed on the memory circuit board, the base and the cover, and a plurality of screws are also required for serving as fasten members; so in production and assembly, the plural screws are used for locking the memory circuit board in the base, and the cover is covered at the outer side of the base, then the plural screws are used for fastening the cover and the base; because of the production issue of the memory circuit board, the base and the cover, the produced memory, the base and the cover are not formed with the unified dimension or the deviation of screw holes formed on the memory circuit board, the base and the cover, thus the three components are not able to be stably combined and the screws are not able to be matched with the screw holes; as a result, many wasted memory circuit boards, bases, covers are generated due to the mismatched dimensions, or the assembled stability is poor because of the dimension deviation; in addition, combing massive amount of screws and screw holes requires a lot of manual forces, so the production efficiency is affected and the production cost is raised; accordingly, the prior art has the above-mentioned disadvantages which shall be improved.

For achieving the above-mentioned objectives, one technical solution provided by the present invention is to provide an assembling buckle structure for memory circuit board, which includes:

a base, the front thereof is formed with a recess part, two sides thereof are respectively formed with an elastic lateral plate, wherein the upper, the middle and the lower portion of the lateral plate are inwardly and concavely formed with at least a buckle part having an oblique guide plate, a mounting slot and an abutting part; two outer sides of the lateral plate are formed with at least an outer mounting convex adjacent to the buckle part, the rear end of the base is formed with a tail plate, wherein the upper, the middle and the lower portion of the tail plate are inwardly and concavely formed with at least a buckle part having an oblique guide plate, a mounting slot and an abutting part;

a memory circuit board disposed in the base, two sides and the rear end thereof are respectively corresponding to the mounting slots and the abutting parts of the buckle parts of the two lateral plates of the base and the mounting slot and the abutting part of the buckle part of the tail plate, the front end of the memory circuit board is further formed with a connection seat corresponding to the recess part of the base, and two sides of the connection seats are respectively formed with a concave groove; and a cover covered and engaged with base, the front end thereof is formed with a penetrated hole corresponding to the connection seat of the memory circuit board, the cover utilizes two edges of the penetrated hole for being covered, positioned and fastened with the concave grooves at two sides of the connection seat of the memory circuit board, and two inner ends of the cover are formed with at least an inner mounting concave corresponding to the outer mounting convex of the lateral plate of the base.

According to the present invention, two sides of the cover are further formed with at least a detach hole allowing the cover and the base to be assembled or detached.

According to the present invention, the front and the rear ends of the lateral plate are inwardly and protrudingly formed with at least a fasten post formed having a fasten hole and adjacent to the outer mounting convex.

According to the present invention, two sides of the cover are further formed with at least a fasten penetrated hole corresponding to the fasten post of the lateral plate of the base thereby allowing a fasten member to be sleeved and fastened.

According to the present invention, two ends of the base are further formed with at least a fasten post having a fasten hole.

Preferably, the oblique guide plates and the abutting parts of the buckle parts respectively formed on the lateral plates and the tail plate are correspondingly arranged or staggeringly arranged.

Preferably, the oblique guide plates of the buckle parts of the lateral plates and the tail plate are obliquely oriented towards outward.

Comparing to prior art, advantages achieved by the present invention are as following: two sides of the memory circuit board are able to be mounted in the buckle parts formed on the elastic lateral plates of the base, and the rear end of the memory circuit board is able to be mounted in the buckle part formed on the tail plate of the base, thereby eliminating the gap between the memory circuit board and the base; the cover utilizes the two edges of the penetrated hole for being covered, positioned and fastened with the concave grooves formed at two sides of the connection seat of the memory circuit board, and the inner mounting concaves at two sides of the cover are enabled to be mounted with the outer mounting convexes formed on the two lateral plates of the base so as to be mutually combined; as such, the memory circuit board, the base and the cover are able to be stably buckled and combined in any direction without using any screw, thereby increasing the convenience in assembly. Accordingly, the assembling buckle structure for memory circuit board provided by the present invention is novel and more practical in use comparing to prior art.

DETAILED DESCRIPTION OF THE PREFERRED EMBODIMENT

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
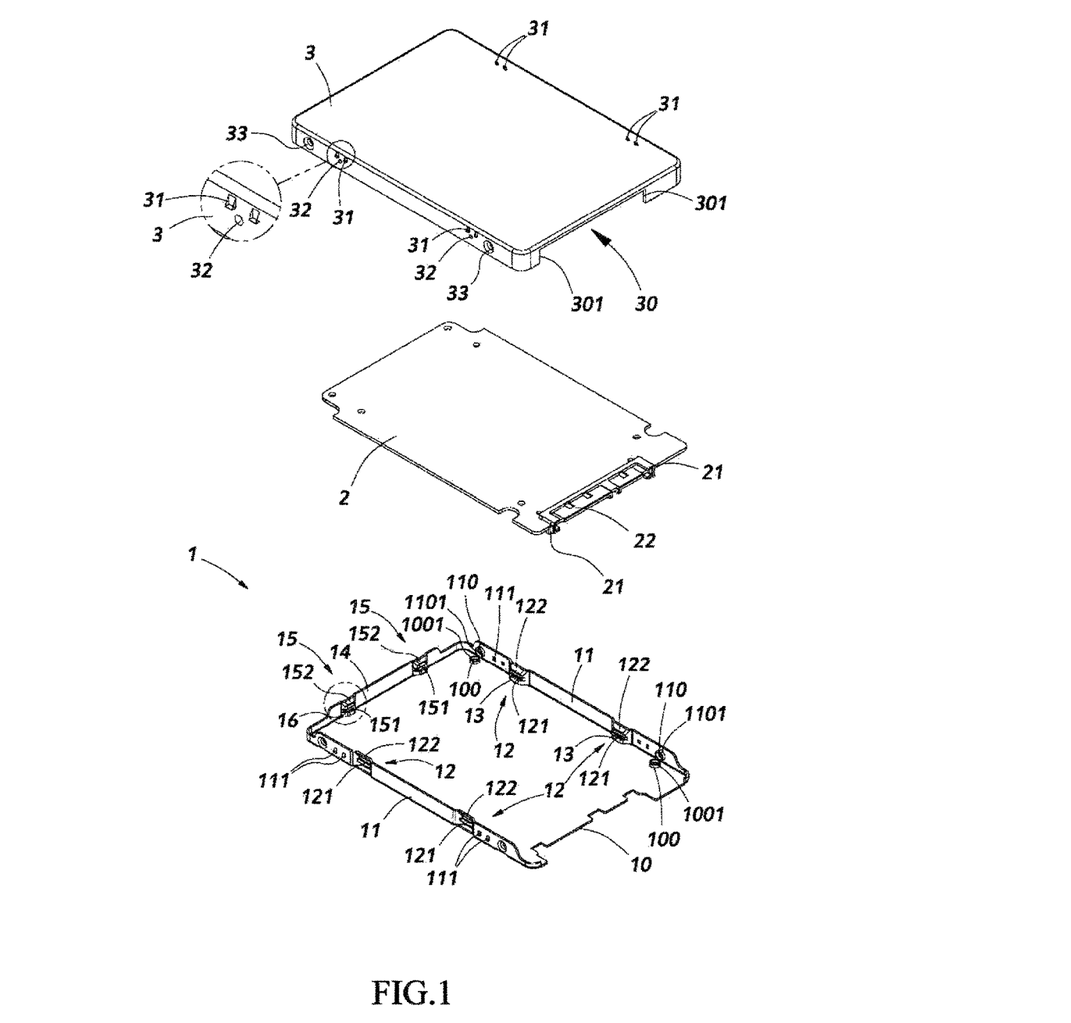
FIG. 1 is a perspective exploded view according to the present invention.
Figure 2:
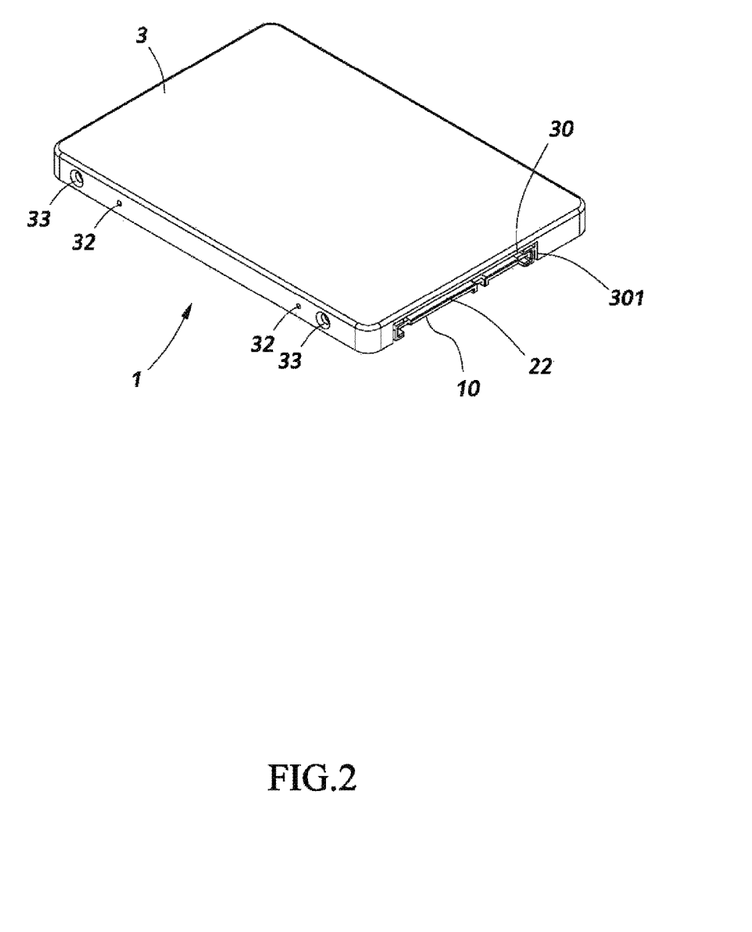
FIG. 2 is a perspective view showing the assembly according to the present invention.
Figure 3:
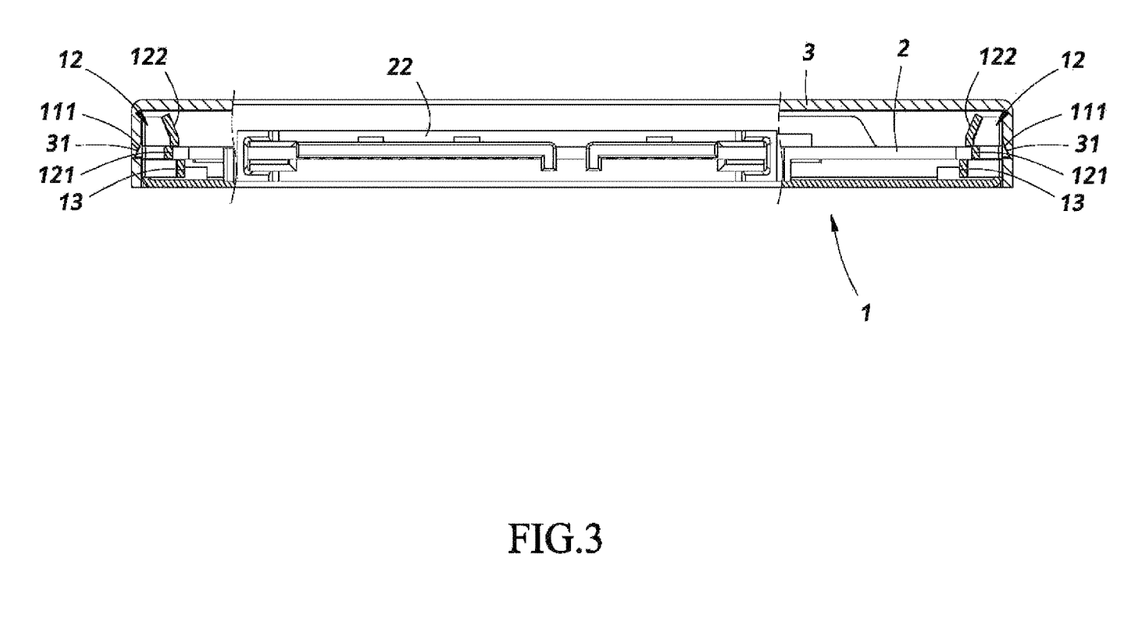
FIG. 3 is a cross sectional view showing the assembly according to the present invention.
Figure 4:
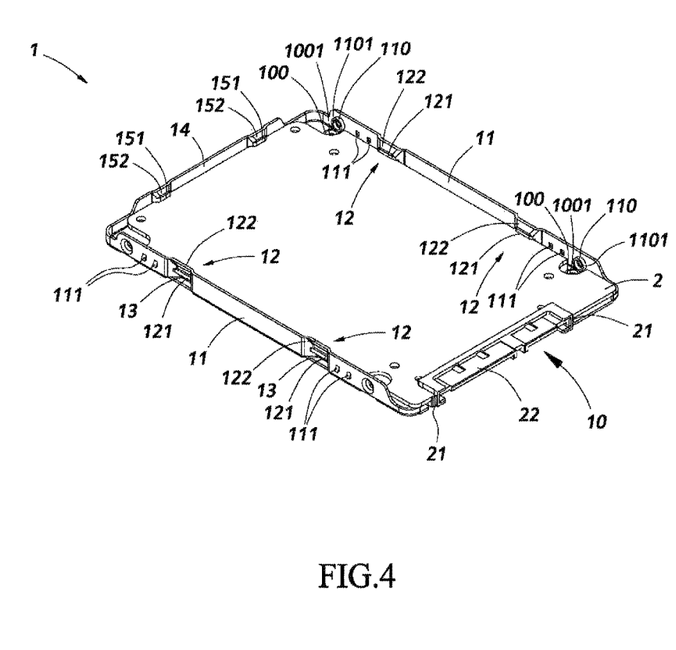
FIG. 4 is a schematic view illustrating the memory circuit board being buckled with the base but the cover yet being covered according to the present invention.

Referring from FIG. 1 to FIG. 4, wherein FIG. 1 is a perspective exploded view according to the present invention; FIG. 2 is a perspective view showing the assembly according to the present invention; FIG. 3 is a cross sectional view showing the assembly according to the present invention; and FIG. 4 is a schematic view illustrating the memory circuit board being buckled with the base but the cover yet being covered according to the present invention. According to one preferred embodiment of the present invention, the assembling buckle structure for memory circuit board includes a base 1, a memory circuit board 2 and a cover 3.

Figure 6:
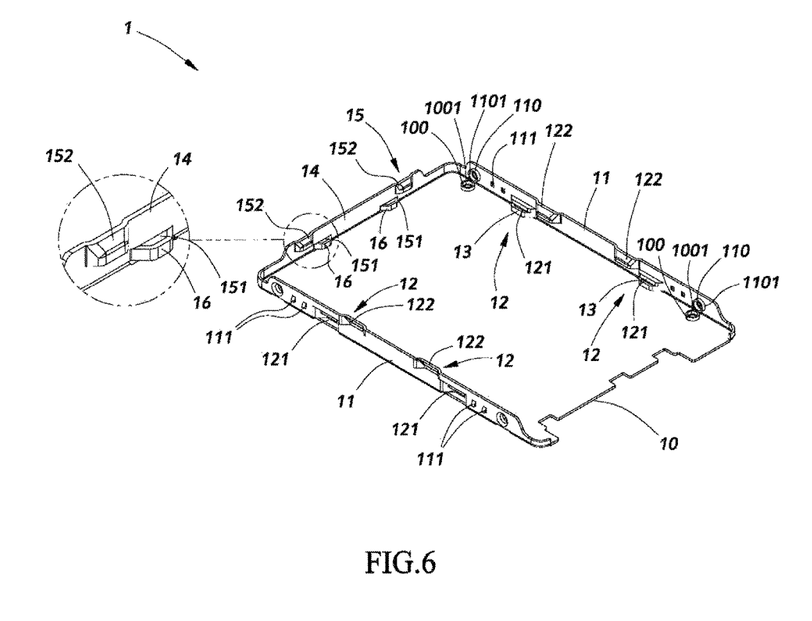
FIG. 6 is a schematic view illustrating the oblique guide plates and the abutting parts of the buckle parts respectively formed on the lateral plate and the tail plate being staggeringly arranged.

The front end of the base 1 is formed with a recess part 10 and two sides thereof are respectively formed with an elastic lateral plate 11, wherein the upper, the middle and the lower portion of the lateral plate 11 are inwardly and concavely formed with at least a buckle part 12 having an oblique guide plate 122, a mounting slot 121 and an abutting part 13; two outer sides of the lateral plate 11 are formed with at least an outer mounting convex 111 adjacent to the buckle part 12, and the front and the rear ends of the lateral plate 11 are inwardly and protrudingly formed with at least a fasten post 110 adjacent to the outer mounting convex 111, the rear end of the base 1 is formed with a tail plate 14, wherein the upper, the middle and the lower portion of the tail plate 14 are inwardly and concavely formed with at least a buckle part 15 having an oblique guide plate 152, a mounting slot 151 and an abutting part 16; the oblique guide plate 122 of the buckle part 12 of the lateral plate 11 is formed in an outward tilting status for being easily to be outwardly stretched; for enabling the lateral plates 11 adjacent to two ends of the base 1 to be provided with a fastening function, at least a fasten post 110 is protrudingly formed thereby allowing a fasten member to be provided and fastened thereon; according to this embodiment, the centers of the fasten posts 110, 100 of the lateral plate 11 and the base 1 are respectively formed with a fasten hole 1101, 1001, and each of the fasten holes 1101, 1001 is formed with inner threads; moreover, according to this embodiment, the oblique guide plates 122, 152 and the abutting parts 13, 16 of the buckle parts 12, 15 of the lateral plate 11 and the tail plate 14 are symmetrically arranged (as shown in FIG. 1 to FIG. 4), what shall be addressed is that the scope of the present invention is not limited to the above-mentioned arrangement, the oblique guide plates 122, 152 and the abutting parts 13, 16 can also be staggeringly arranged (as shown in FIG. 6, which is a schematic view illustrating the oblique guide plates and the abutting parts of the buckle parts respectively formed on the lateral plate and the tail plate being staggeringly arranged).

The memory circuit board 2 is disposed in the base 1, and two sides and the rear end thereof are respectively corresponding to the mounting slots 121 and the abutting parts 13 of the buckle parts 12 of the two lateral plates 11 of the base 1 and the mounting slot 151 and the abutting part 16 of the buckle part 15 of the tail plate 14, the front end of the memory circuit board 2 is further formed with a connection seat 22 corresponding to the recess part 10 of the base 1, and two sides of the connection seats 22 are respectively formed with a concave groove 21.

The cover 3 is covered and engaged with base 1, the front end thereof is formed with a penetrated hole 30 corresponding to the connection seat 22 of the memory circuit board 2, the cover 3 utilizes two edges 301 of the penetrated hole 30 for being covered, positioned and fastened with the concave grooves 21 at two sides of the connection seat 22 of the memory circuit board 2, two inner ends of the cover 3 are formed with at least an inner mounting concave 31 corresponding to the outer mounting convex 111 of the lateral plate 11 of the base 1; two sides of the cover 3 are further formed with at least a detach hole 32 allowing the cover 3 and the base 1 to be assembled or detached; a sharp member can be provided and penetrated into the detach hole 32 to force the lateral plate 11 of the base 1 to be inwardly retracted, so the outer mounting convex 111 of the lateral plate 11 of the base 1 is enabled to be separated from the inner mounting concave 31 at two sides of the cover 3 thereby allowing the base 1 and the cover 3 to be detached and separated; according to this embodiment, two sides of the cover 3 are further formed with at least a fasten penetrated hole 33 corresponding to the fasten post 110 of the lateral plate 11 of the base 1 thereby allowing a fasten member to be sleeved and fastened.

Figure 5:
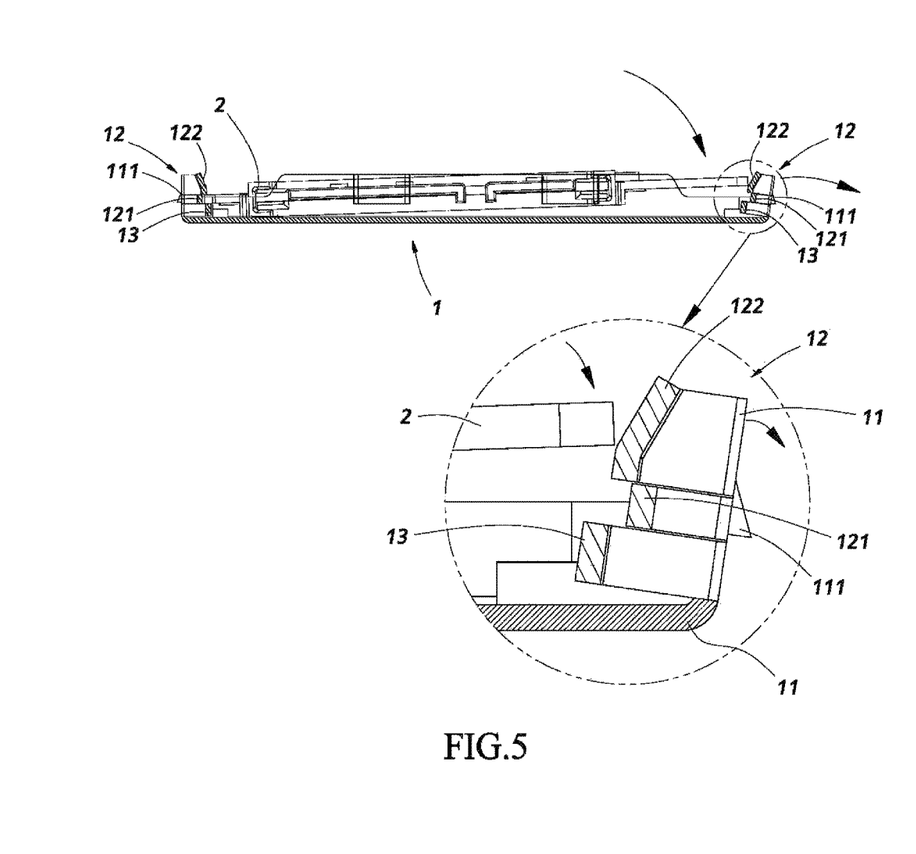
FIG. 5 is a schematic view illustrating the memory circuit board being buckled with the base and the lateral plate of the base being outwardly stretched according to the present invention.

Referring to FIG. 5, which a schematic view illustrating the memory circuit board being buckled with the base and the lateral plate of the base being outwardly stretched according to the present invention; the assembly of the present invention is very easy, the base 1 is firstly placed on a plane, then one side of the memory circuit board 2 is obliquely oriented for being mounted in the mounting slot 121 of the buckle part 12 formed on the lateral plate 11 at one side of the base 1 and abutted against the abutting part 13 at the bottom of the buckle part 12, another side of the memory circuit board 2 is downwardly moved for being adjacent to the oblique guide plate 122 formed at the upper portion of the buckle part 12 on the other lateral plate 11 of the base 1; when the other side of the memory circuit board 2 is continuously and downwardly pressed towards the base 1, because the top of the buckle part 12 of the lateral plate 11 is formed with the oblique guide plate 122 obliquely oriented towards outward, the downward pressing motion of the memory circuit board 2 would force the elastic lateral plate 11 to be outwardly stretched (as shown in FIG. 5), when the memory circuit board 2 is further pressed towards downward, the other side of the memory circuit board 2 is able to be mounted in the mounting slot 121 of the corresponding buckle part 12 and abutted against the abutting part 13 at the bottom of the buckle part 12, meanwhile the memory circuit board 2 is moved towards the tail plate 14 for being mounted in the mounting slot 151 of the corresponding buckle part 15 of the tail plate 14 and abutted against the abutting part 16 at the bottom of the buckle part 15, thereby enabling the lateral plate 11 in an outwardly stretching status to be recovered (as shown in FIG. 4), thus the base 1 is able to tightly buckle and fasten the memory circuit board 2.

When the memory circuit board 2 is buckled with the base 1 and the cover 3 is desired to be engaged thereon, the cover 3 is disposed on top of the base 1 having the memory circuit board 2 fastened therein (as shown in FIG. 1), then the cover 3 is downwardly pressed, two sides of the at least one inner mounting concave 31 formed at two sides thereof are outwardly stretched till the inner mounting concaves 31 at two sides of the cover 3 being mounted in the outer mounting convexes 111 of the two lateral plates 11 of the base 1, meanwhile the two edges 301 of the penetrated hole 30 of the cover 3 are served to cover and fasten the concave grooves 21 formed at two sides of the connection seat 22 at the front of the memory circuit board 2, thereby allowing two sides of the cover 3 in an outwardly stretching status to be recovered (as shown in FIG. 2 and FIG. 3); the fasten penetrated hole 33 of the cover 3 and the corresponding fasten post 110 formed with the fasten hole 1101 of the base 1 can be fastened through being provided with a fasten member.

Based on what has been disclosed above, two sides of the memory circuit board 2 are enabled to be mounted in the buckle parts 12 of the two elastic lateral plates 11 of the base 1, and the rear end of the memory circuit board 2 is enabled to be mounted in the buckle part 15 of the tail plate 14 of the base 1, thereby eliminating the gap formed between the memory circuit board 2 and the base 1; the cover 3 utilizes the two edges 301 of the penetrated hole 30 for being covered, positioned and fastened with the concave grooves 21 formed at two sides of the connection seat 22 of the memory circuit board 2, and the inner mounting concaves 31 at two sides of the cover 3 are enabled to be mounted with the outer mounting convexes 111 formed on the two lateral plates 11 of the base 1 so as to be mutually combined; as such, the memory circuit board 2, the base 1 and the cover 3 are able to be stably buckled and combined in any direction without using any screw, thereby increasing the convenience in assembly. Accordingly, the assembling buckle structure for memory circuit board provided by the present invention is novel and more practical in use comparing to prior art.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. An assembling buckle structure for memory circuit board, including:
   a base, the front thereof being formed with a recess part, two sides thereof being respectively formed with an elastic lateral plate, wherein the upper, the middle and the lower portion of the lateral plate being inwardly and concavely formed with at least a buckle part having an oblique guide plate, a mounting slot and an abutting part, two outer sides of the lateral plate being formed with at least an outer mounting convex adjacent to the buckle part, the rear end of the base being formed with a tail plate, wherein the upper, the middle and the lower portion of the tail plate being inwardly and concavely formed with at least a buckle part having an oblique guide plate, a mounting slot and an abutting part;
   a memory circuit board, disposed in the base, two sides and the rear end thereof being respectively corresponding to the mounting slots and the abutting parts of the buckle parts of the two lateral plates of the base and the mounting slot and the abutting part of the buckle part of the tail plate, the front end of the memory circuit board being further formed with a connection seat corresponding to the recess part of the base, and two sides of the connection seats being respectively formed with a concave groove; and
   a cover, covered and engaged with base, the front end thereof being formed with a penetrated hole corresponding to the connection seat of the memory circuit board, the cover utilizing two edges of the penetrated hole for being covered, positioned and fastened with the concave grooves at two sides of the connection seat of the memory circuit board, and two inner ends of the cover being formed with at least an inner mounting concave corresponding to the outer mounting convex of the lateral plate of the base.

2. The assembling buckle structure for memory circuit board according to claim 1, wherein two sides of the cover are further formed with at least a detach hole allowing the cover and the base to be assembled or detached.

3. The assembling buckle structure for memory circuit board according to claim 1, wherein the front and the rear ends of the lateral plate are inwardly and protrudingly formed with at least a fasten post formed having a fasten hole and adjacent to the outer mounting convex.

4. The assembling buckle structure for memory circuit board according to claim 2, wherein the front and the rear ends of the lateral plate are inwardly and protrudingly formed with at least a fasten post formed having a fasten hole and adjacent to the outer mounting convex.

5. The assembling buckle structure for memory circuit board according to claim 3, wherein two sides of the cover are further formed with at least a fasten penetrated hole corresponding to the fasten post of the lateral plate of the base thereby allowing a fasten member to be sleeved and fastened.

6. The assembling buckle structure for memory circuit board according to claim 4, wherein two sides of the cover are further formed with at least a fasten penetrated hole corresponding to the fasten post of the lateral plate of the base thereby allowing a fasten member to be sleeved and fastened.

7. The assembling buckle structure for memory circuit board according to claim 1, wherein two ends of the base are further formed with at least a fasten post having a fasten hole.

8. The assembling buckle structure for memory circuit board according to claim 1, wherein the oblique guide plates and the abutting parts of the buckle parts respectively formed on the lateral plates and the tail plate are correspondingly arranged or staggeringly arranged.

9. The assembling buckle structure for memory circuit board according to claim 5, wherein the oblique guide plates and the abutting parts of the buckle parts respectively formed on the lateral plates and the tail plate are correspondingly arranged or staggeringly arranged.

10. The assembling buckle structure for memory circuit board according to claim 6, wherein the oblique guide plates and the abutting parts of the buckle parts respectively formed on the lateral plates and the tail plate are correspondingly arranged or staggeringly arranged.

11. The assembling buckle structure for memory circuit board according to claim 1, wherein the oblique guide plates of the buckle parts of the lateral plates and the tail plate are obliquely oriented towards outward.

12. The assembling buckle structure for memory circuit board according to claim 5, wherein the oblique guide plates of the buckle parts of the lateral plates and the tail plate are obliquely oriented towards outward.

13. The assembling buckle structure for memory circuit board according to claim 6, wherein the oblique guide plates of the buckle parts of the lateral plates and the tail plate are obliquely oriented towards outward.

* * * * *